(12) United States Patent
Monda et al.

(10) Patent No.: US 8,054,640 B2
(45) Date of Patent: Nov. 8, 2011

(54) ELECTRONIC APPARATUS HAVING SELF-DIAGNOSIS CAPABILITY

(75) Inventors: Tomoko Monda, Yokohama (JP); Minoru Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 12/136,351

(22) Filed: Jun. 10, 2008

(65) Prior Publication Data

US 2008/0310130 A1 Dec. 18, 2008

(30) Foreign Application Priority Data

Jun. 12, 2007 (JP) ............................ P.2007-155576

(51) Int. Cl.
*H05K 5/00* (2006.01)

(52) U.S. Cl. ........ 361/752; 361/758; 361/770; 361/771; 361/790

(58) Field of Classification Search .................. 361/770, 361/771, 790, 752, 758
See application file for complete search history.

(56) References Cited

U.S. PATENT DOCUMENTS

| | | | | |
|---|---|---|---|---|
| 5,334,029 | A * | 8/1994 | Akkapeddi et al. | 439/66 |
| 5,363,276 | A * | 11/1994 | Crockett | 361/752 |
| 5,917,709 | A * | 6/1999 | Johnson et al. | 361/803 |
| 6,249,442 | B1 * | 6/2001 | Watanabe | 361/801 |
| 6,493,233 | B1 * | 12/2002 | De Lorenzo et al. | 361/752 |
| 2005/0018371 | A1 * | 1/2005 | Mladenik et al. | 361/78 |
| 2006/0077642 | A1 * | 4/2006 | Estes et al. | 361/752 |
| 2008/0068814 | A1 | 3/2008 | Monda et al. | |

FOREIGN PATENT DOCUMENTS

| | | |
|---|---|---|
| JP | 11-298169 | 10/1999 |
| JP | 2001-7550 | 1/2001 |
| JP | 3265197 | 12/2001 |

* cited by examiner

*Primary Examiner* — Tuan T Dinh
*Assistant Examiner* — Steven Sawyer
(74) *Attorney, Agent, or Firm* — Finnegan, Henderson, Farabow, Garrett & Dunner, L.L.P.

(57) ABSTRACT

An electronic apparatus includes: a circuit board that is disposed inside a case that is formed by coupling first and second case halves, the circuit board being interposed between first and second boss portions; first and second conductive members that are disposed between a gap formed between the first boss portion and the circuit board; a third conductive member that is disposed between the first boss portion and the first conductive member and between the first boss portion and the second conductive member to electrically connect the first conductive member to the second conductive member; and a measurement circuit that is electrically connected to a first wiring and a second wiring, which are respectively connected to the first conductive member and the second conductive member, and measures an electrical characteristic value of at least one of the first conductive member and the second conductive member.

6 Claims, 8 Drawing Sheets

ELECTRONIC APPARATUS HAVING SELF-DIAGNOSIS CAPABILITY

RELATED APPLICATION(S)

The present disclosure relates to the subject matter contained in Japanese Patent Application No. 2007-155576 filed on Jun. 12, 2007, which is incorporated herein by reference in its entirety.

FIELD

The present invention relates to an electronic apparatus.

BACKGROUND

In recent years, a demand for high performance and a multi-function of an electronic apparatus mounted with a semiconductor device has been increased. In response to this demand, integration in large-scale and increase of a size are progressed in a semiconductor chip. Accordingly, the number of electrical contacts for connecting a semiconductor package and a circuit board for mounting the semiconductor chips has considerably been increased.

The increase in the number of the electrical contacts results in an increase in thermal variation occurring inside an electronic apparatus. Accordingly, there arises a problem in that a relative displacement caused due to a difference in a linear expansion coefficient of the semiconductor package and the circuit board occurs between the semiconductor package and the circuit board since the thermal variation is repeated.

An example of a technique for detecting the damage of the electrical contacts caused due to thermal fatigue beforehand is disclosed in JP-A-10-093297.

The document JP-A-10-093297 discloses a technique to provide a sensing bump, other than an electrically connecting bump, for electrically connecting the semiconductor package to the circuit board. An electric resistance value of a connection passage including the sensing bump is automatically detected to determine whether the electrical contacts are damaged by the thermal fatigue when the electric resistance value exceeds a predetermined level.

However, the technique disclosed in the document JP-A-10-093297 has a problem in that it is difficult to design the configuration of the sensing bump and it is difficult to allow a lifespan of the sensing bump to be less than that of other bumps, since the height of the sensing bump provided in the semiconductor package has to be designed so as to be the same as the height of other bumps. That is, if the lifespan of the sensing bump is nearly equal to or more than that of other bumps, those other bumps may be damaged due to the thermal fatigue faster than the sensing bump. Accordingly, a purpose for detecting the electric resistance value beforehand may not be achieved. Moreover, in order to realize the technique disclosed in the document JP-A-10-093297, the sensing bump has to be provided in all mount elements since the sensing bump only allows to detect the damage of the own package caused by the thermal fatigue.

SUMMARY

According to one aspect of the invention, there is provided an electronic apparatus including: a first case half that is provided with a first boss portion; a second case half that is provided with a second boss portion, the second case half being coupled with the first case half to form a single case by joining the first boss portion and the second boss portion; a circuit board that is disposed inside the case, the circuit board being interposed between the first boss portion and the second boss portion; a first conductive member and a second conductive member that are disposed between a gap formed between the first boss portion and the circuit board; a third conductive member that is disposed between the first boss portion and the first conductive member and between the first boss portion and the second conductive member to electrically connect the first conductive member to the second conductive member; a first wiring and a second wiring that are formed on the circuit board, the first wiring and the second wiring being electrically connected respectively to the first conductive member and the second conductive member; and a measurement circuit that is electrically connected to the first wiring and the second wiring and measures an electrical characteristic value of at least one of the first conductive member and the second conductive member.

BRIEF DESCRIPTION OF THE DRAWINGS

In the accompanying drawings:

FIGS. 2A-2C are enlarged diagrams illustrating a part of first boss portions, second boss portions, and a circuit board of the electronic apparatus according to the first embodiment, wherein FIGS. 2A, 2B, and 2C are an exploded perspective view, a sectional view, and a top view illustrating the circuit board, respectively;

FIGS. 3A and 3B are diagrams for explaining an electronic apparatus according to a second embodiment of the present invention, wherein FIG. 3A is an enlarged sectional view illustrating boss portions and FIG. 3B is a top view illustrating a circuit board;

FIGS. 4A and 4B are diagrams for explaining an electronic apparatus according to a third embodiment of the present invention, wherein FIG. 4A is an enlarged sectional view illustrating boss portions and FIG. 4B is a top view illustrating a circuit board;

FIGS. 5A and 5B are diagrams for explaining an electronic apparatus according to a fourth embodiment of the present invention, wherein FIG. 5A is an enlarged sectional view illustrating boss portions and FIG. 5B is a bottom view illustrating a first conductive member and a second conductive member monolithically formed in a third conductive member;

FIGS. 6A-6C are diagrams for explaining an electronic apparatus according to a fifth embodiment of the present invention, wherein FIG. 6A is an enlarged sectional view illustrating boss portions, FIG. 6B and FIG. 6C are a perspective view and a bottom view illustrating a first conductive member and a second conductive member monolithically formed in a third conductive member, respectively;

FIGS. 7A and 7B are diagrams for explaining an electronic apparatus according to a sixth embodiment of the present invention, wherein FIG. 7A is an enlarged sectional view illustrating boss portions and FIG. 7B is a top view illustrating plural conductors formed on a wiring board; and FIGS. 8A and 8B are diagrams for explaining an electronic apparatus according to a seventh embodiment of the present invention, wherein FIG. 8A is an enlarged sectional view illustrating boss portions and FIG. 8B is a perspective view illustrating a first conductive member formed in a wiring board while a second conductive member and a third conductive member monolithically formed with each other.

DETAILED DESCRIPTION OF THE EMBODIMENTS

Hereinafter, embodiments of the present invention will be described in detail with reference to the drawings. The present invention is not limited to the embodiments described below and may be modified without departing the scope of the claimed invention.

Figure 1:
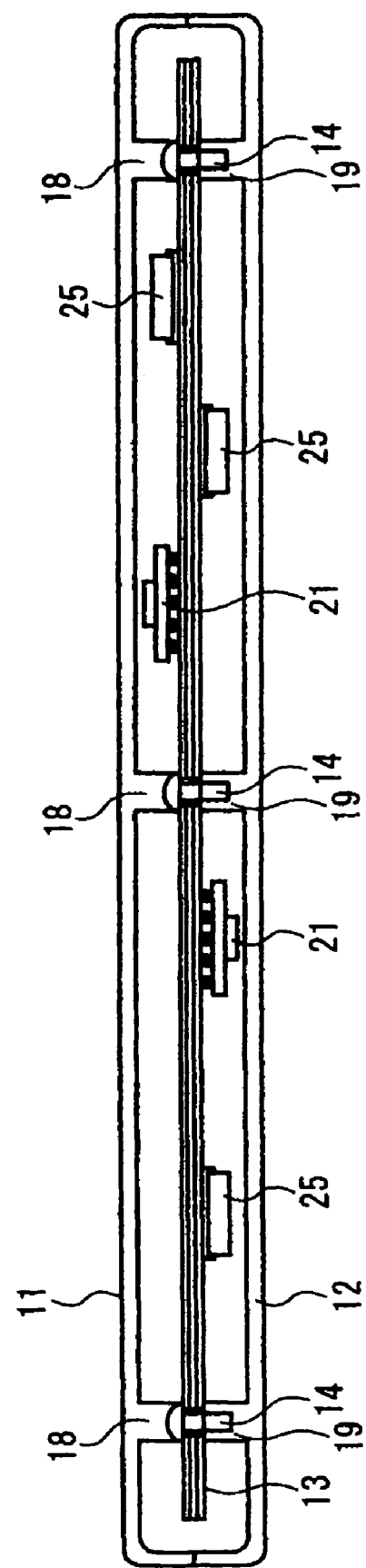
FIG. 1 is a sectional view illustrating an electronic apparatus according to a first embodiment of the present invention.

FIG. 1 is a sectional view illustrating an electronic apparatus according to a first embodiment.

As shown in FIG. 1, the electronic apparatus includes: a first case half 11 that is formed with first boss portions 18 therein; and a second case half 12 that is formed with second boss portions 19 therein. The first case half 11 and the second case half 12 are coupled with each other by joining the first boss portions 18 and the second boss portions 19 to form a single case. The electronic apparatus further includes; a circuit board 13; and a semiconductor packages 21 and passive components 25 which are bump-connected onto the circuit board 13. The circuit board 13 is nipped between the first boss portions 18 and the respective second boss portions 19 and disposed within the coupled case formed by the first case half 11 and the second case half 12 to be suspended by each pairs of the first boss portions 18 and the second boss portions 19.

The first case halt 11, the second case half 12, and the circuit board 13 are fixed with one another between each pairs of the first boss portions 18 and the second boss portions 19 by boss screws 14.

Figure 2A:
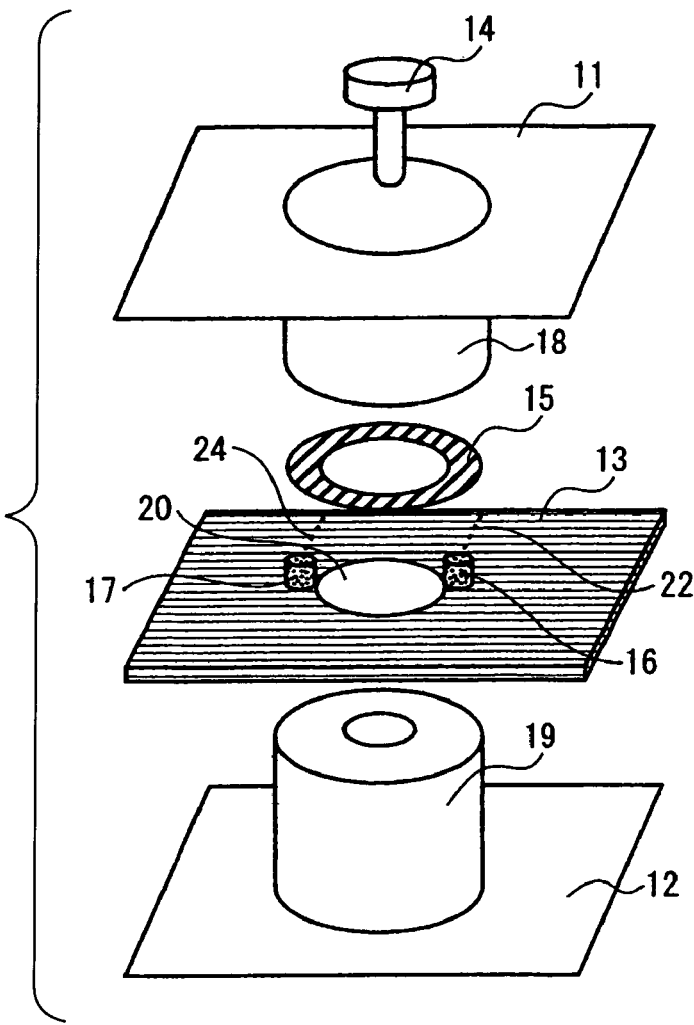
Figure 2B:
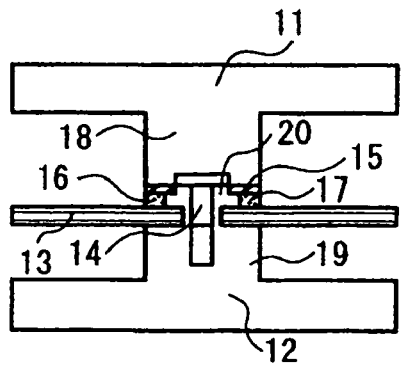
Figure 2C:
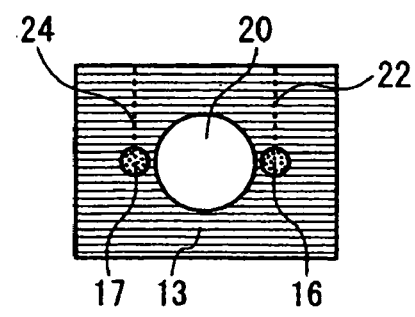

FIGS. 2A-2C are enlarged diagrams illustrating a part of the first boss portions 18, the second boss portions 19, and the circuit board 13 of the electronic apparatus according to the first embodiment. FIGS. 2A-2C are an exploded perspective view, a sectional view, and a top view illustrating the circuit board 13, respectively.

As shown in FIGS. 2A-2C, the electronic apparatus includes: a first conductive member 16 and a second conductive member 17 which are provided in a gap 20 formed between the first boss portion 18 and the circuit board 13; a third conductive member 15 which is provided between the first boss portion 18 and the first conductive member 16 and between the first boss portion 18 and the second conductive member 17 to electrically connect the first conductive member 16 to the second conductive member 17; and a first wiring 22 and a second wiring 24 which are formed on the circuit board 13 to be electrically connected to the first conductive member 16 and the second conductive member 17, respectively.

The third conductive member 15 is formed in a ring shape, but may be formed in a half-ring shape or other shapes as long as the first conductive member 16 and the second conductive member 17 are electrically connected to each other. The third conductive member 15 may be electrically connected with the first conductive member 16 and the second conductive member 17 by way of other member having a inductance or a capacitance. In the embodiment, the third conductive member 15 is formed in a plate shape made of metal.

The first conductive member 16 and the second conductive member 17 are formed of a Sn-3.0Ag-0.5Cu solder material of a convex shape and are mounted on the circuit board 13 at the circumference of the gap 20 formed between the first boss portion 18 and the circuit board 13 by a soldering process as like other elements, such as the active component 25 and the semiconductor package 21.

As shown in FIGS. 2A and 2C, the first wiring 22 and the second wiring 24 are electrically connected to the semiconductor package 21 (see FIG. 1) formed on a wiring board 3 through a bump. A measurement circuit that measures an electrical characteristic value of the first conductive member 16 and the second conductive member 17 is formed inside the semiconductor package 21.

Inside the semiconductor package 21, there is provided a functional circuit which is connected to the measurement circuit to output a signal when the electrical characteristic value is beyond a predetermined level. For example, the functional circuit is designed so as to give warning message or the like on a display screen of a computer to instruct the fact that the lifespan of a board is likely to finish when a resistance value becomes infinity due to the fracture of the first conductive member 16 or the second conductive member 17. In addition, the semiconductor package 21 includes a functional circuit that outputs a signal when the tendency of variation in the electrical characteristic value is changed. In this case, the normal tendency of variation in an electrical characteristic value is stored to periodically perform a comparison, and it is possible to determine whether the lifespan is likely to finish by detecting a tendency different from the normal tendency of variation in the characteristic value.

In the embodiment, the first wiring 22, the first conductive member 16, the third conductive member 15, the second conductive member 17, and the second wiring 24 are sequentially conducted in series to form a series circuit. The measurement circuit formed inside the semiconductor package 21 has a function for automatically and regularly measuring an electric resistance value of the series circuit.

A relative displacement caused by a difference in a linear expansion coefficient of the semiconductor package 21 and the circuit board 13 is larger than a relative displacement caused by a difference in a linear expansion coefficient of the first case half 11 and the circuit board 13. Accordingly, the strain occurring in a bump portion of the semiconductor package 21 and the circuit board 13 is larger than the strain occurring in the boss portions 18 and 19 where the first case half 11 and the circuit board 13 are joined with each other. An average strain value is obtained by dividing the relative displacement by the height of a joining portion. Accordingly, the average strain value can be as a parameter for setting a fatigue life slightly shorter than that of the semiconductor package 21 when the height of the first conductive member 16 is the same as or is slightly higher than that of the second conductive member 17.

Specifically, the electronic apparatus may be designed as follows.

In a case where the first case half 11 and the second case half 12 are generally formed of a resin or a magnesium alloy, the respective thermal expansion coefficients thereof are at about 80 ppm/° C. in the resin case and about 26 ppm/° C. in the magnesium case. For example, when the first case half 11 and the second case half 12 are formed of a resin, the thermal expansion coefficient is at about 80 ppm/° C. In addition, a thermal expansion coefficient of the circuit board 13 is at about 15 ppm/° C. and a thermal expansion coefficient of the semiconductor package 21 is at about 13 ppm/° C. When a variation range of a temperature is set to 20° C., a distance between the bosses is set to 150 mm, and the size of the semiconductor 21 is set to 35 mm×35 mm, an expansion difference between the first case half 11 or the second case half 12 and the circuit board 13 is about 0.2 mm and an expansion difference between the semiconductor package 21 and the circuit board 13 is about 0.002 mm. Accordingly, it is known that the relative displacement caused by the difference in the linear expansion coefficient of the first case half 11 or the second case half 12 and the circuit board 13 is larger than the relative displacement caused by the difference in the linear expansion coefficient of the semiconductor package 21 and the circuit board 13.

In the electronic apparatus according to the invention, when the height of the first conductive member 16 or the second conductive member 17 is set to the range of one time to 10 times as high as that of the semiconductor package 21 on the circuit board 13, the height of the first conductive member 16 or the second conductive member 17 can be set to be shorter than connection portions of the mount elements including the semiconductor package 21 or the active component 25 mounted onto the circuit board 13.

With such a configuration, before the fracture of the connection portion of the semiconductor package 21 as the mount element, it is possible to beforehand detect that the connection portions of the mount elements on the circuit board 3 is likely to be fractured by detecting an increase in the electric resistance value caused by the fracture of the first conductive member 16 or the second conductive member 17.

In this way, it is possible to easily set the fatigue life shorter than that of the connection portions of the mount elements including the semiconductor package 21 and the passive component 25 by providing the first conductive member 16 and the second conductive member 17 for a sensor in the circumstance of the first boss portion 18. Moreover, it is possible to adjust the lifespan by appropriately changing the height of the first conductive member 16 and the second conductive member 17.

Next, an electronic apparatus according to a second embodiment of the present invention will be described with reference to FIGS. 3A and 3B. The same reference numerals are given the same elements as those in the first embodiment, and the detailed description is omitted.

Figure 3A:
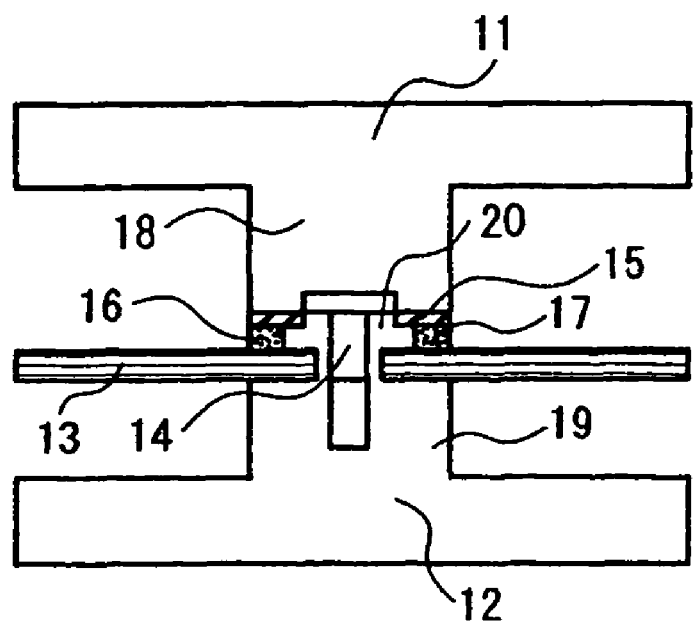
Figure 3B:
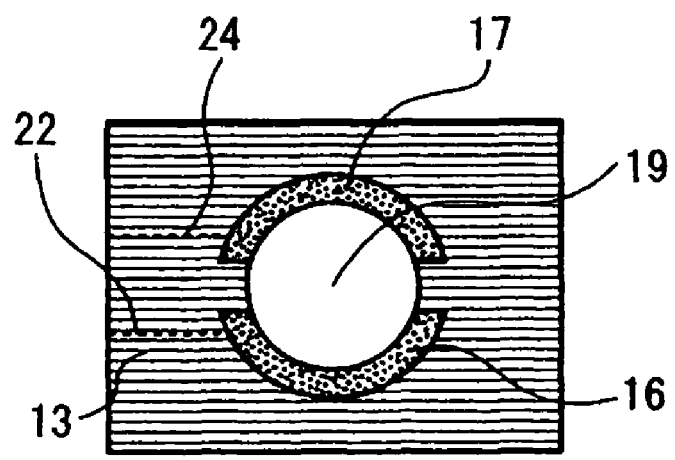

FIG. 3A is an enlarged sectional view illustrating boss portions, and FIG. 3B is a top view illustrating a circuit board 13.

In the second embodiment, a first conductive member 16 and a second conductive member 17 are formed in an arc shape. The shape of the first conductive member 16 and the second conductive member 17 is different from the shape in the first embodiment. However, the other configuration is the same as that in the first embodiment, and the same advantage can be obtained.

In the second embodiment, since the first conductive member 16 and the second conductive member 17 surround the substantially entire circumference of a first boss portion 18 and a second boss portion 19, it is possible to detect fracture with respect to load in any direction.

Next, an electronic apparatus according to a third embodiment of the present invention will be described with reference to FIGS. 4A and 4B. The same reference numerals are given the same elements as those in the first embodiment, and the detailed description is omitted.

Figure 4A:
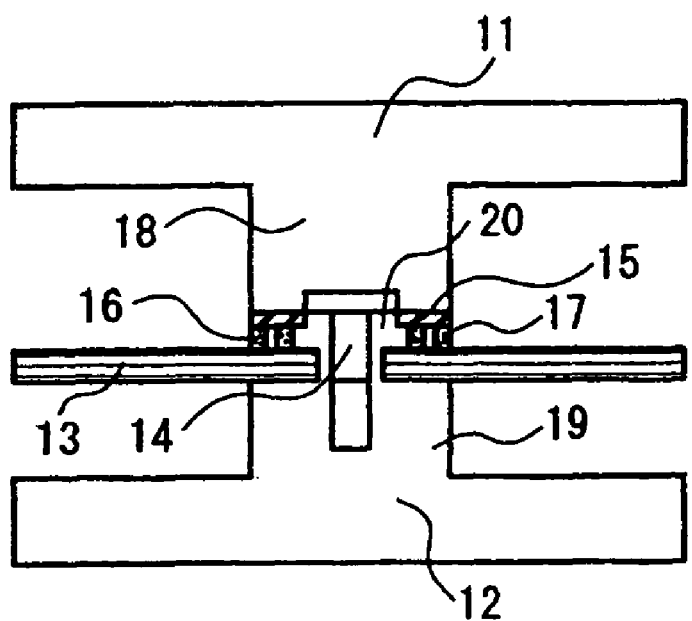
Figure 4B:
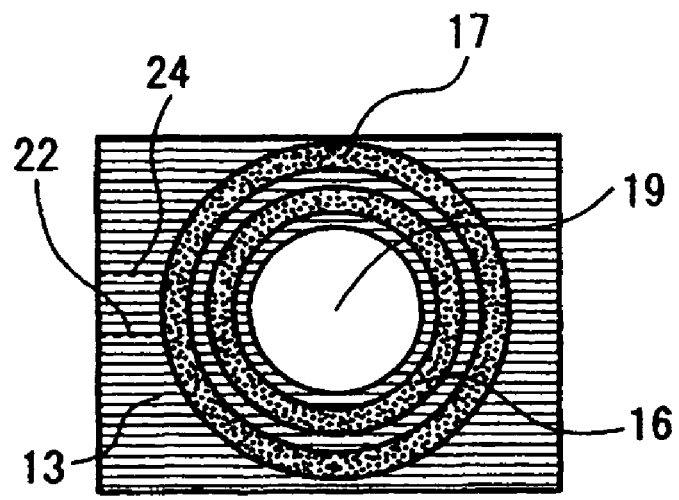

FIG. 4A is an enlarged sectional view illustrating boss portions, and FIG. 4B is a top view illustrating a circuit board 13.

In this embodiment, a first conductive member 16 is formed in a concentric circle shape, and a second conductive member 17 having the concentric circle shape is formed so as to surround the circumference of the first conductive member 16. The shape of the first conductive member 16 and the second conductive member 17 is different from the shape in the first embodiment. However, the rest configuration is the same as that in the first embodiment and has the same advantage.

In the third embodiment, since the first conductive member 16 and the second conductive member 17 surround the substantially entire circumference of a first boss portion 18 and a second boss portion 19, it is possible to detect fracture with respect to load in any direction.

Next, an electronic apparatus according to a fourth embodiment of the present invention will be described with reference to FIGS. 5A and 5B. The same reference numerals are given the same elements as those in the first embodiment, and the detailed description is omitted.

Figure 5A:
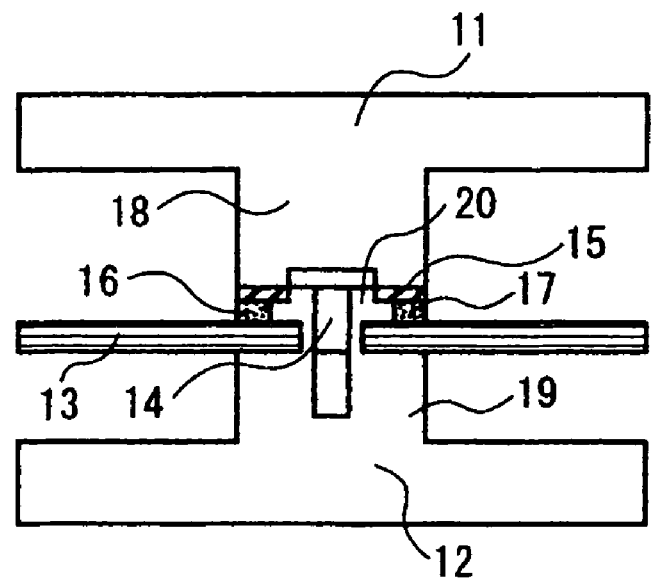
Figure 5B:
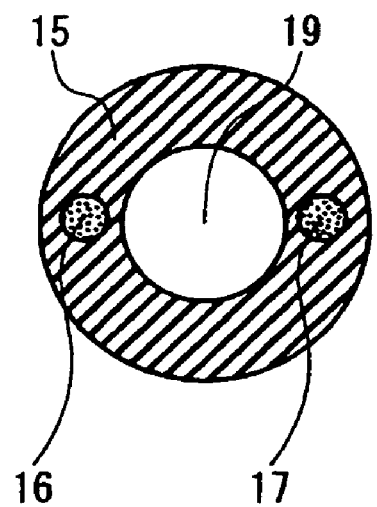

FIG. 5A is an enlarged sectional view illustrating boss portions, and FIG. 5B is a bottom view illustrating a first conductive member 16 and a second conductive member 17 monolithically formed in a third conductive member 15.

In the fourth embodiment, the first conductive member 16 and the second conductive member 17 are monolithically formed on the third conductive member 15. However, the rest configuration is the same as that in the first embodiment and the same advantage can be obtained.

In the fourth embodiment, the third conductive member 15, the first conductive member 16, and the second conductive member 17 are fixed by joining a first case half 11, a second case half 12, and a circuit board 13 with a boss screw 14 in a first boss portion 18 and a second boss portion 19. For example, the third conductive member 15, the first conductive member 16, and the second conductive member 17 can be formed of a Sn-3.0Ag-0.5Cu solder material of a convex shape so as to have a shape shown in FIG. 5B by a cutting process. In addition, the third conductive member 15, the first conductive member 16, and the second conductive member 17 are inserted in a space with the circumference of the first boss portion 18 on the circuit board 3 by screw-fixing.

Next, an electronic apparatus according to a fifth embodiment of the present invention will be described with reference to FIGS. 6A-6C. The same reference numerals are given the same elements as those in the first embodiment, and the detailed description is omitted.

Figure 6A:
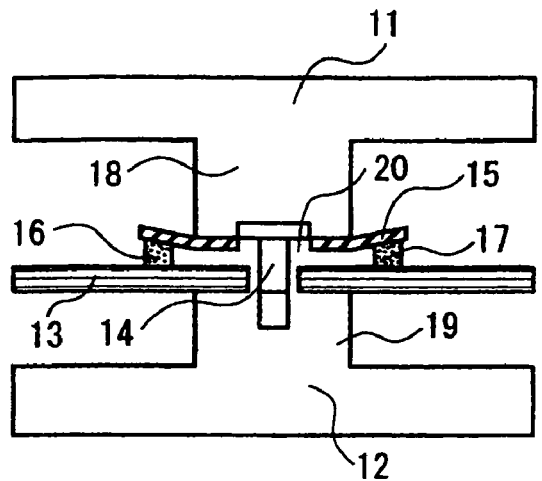
Figure 6B:
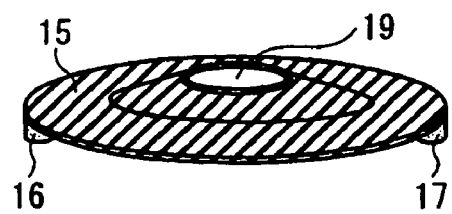
Figure 6C:
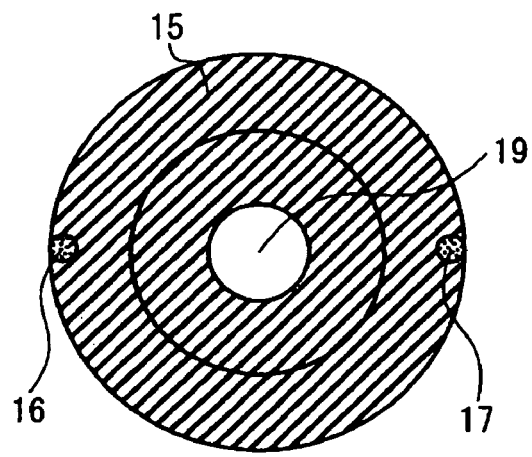

FIG. 6A is an enlarged sectional view illustrating boss portions. FIG. 6B and FIG. 6C are a perspective view and a bottom view illustrating a first conductive member 16 and a second conductive member 17 monolithically formed in a third conductive member 15, respectively.

In the fifth embodiment, the first conductive member 16 and the second conductive member 17 are monolithically formed in the third conductive member 15. However, the other configuration is the same as that in the first embodiment and the same advantage can obtained.

In the fifth embodiment, since the third conductive member 15 is screw-fixed by the boss screw 14 and a force in a lower direction is thus applied to the center portion of the third conductive member 15, the outer circumference of the third conductive member 15 is deformed in a direction getting away from the circuit board 13 and a force in a tensile direction is applied to the first conductive member 16 and the second conductive member 17. When a force in a compression direction is applied to the first conductive member 16 and the second conductive member 17 by the screw-fixing of the boss screw 14, the fractured surfaces come in contact with each other even though the first conductive member 16 and the second conductive member 17 are fractured. Accordingly, there is a possibility that an electric resistance value does not vary. However, in the fifth embodiment, the force in the tensile direction is applied to the first conductive member 16 and the second conductive member 17. Accordingly, it is possible to prevent the phenomenon that the electric resistance value does not vary even though the first conductive member 16 and the second conductive member 17 are fractured.

Next, an electronic apparatus according to a sixth embodiment of the present invention will be described with reference to FIGS. 7A and 7B. The same reference numerals are given the same elements as those in the first embodiment, and the detailed description is omitted.

Figure 7A:
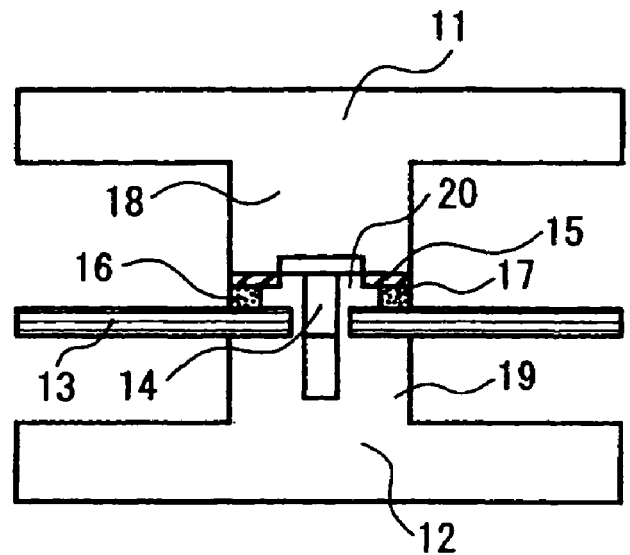
Figure 7B:
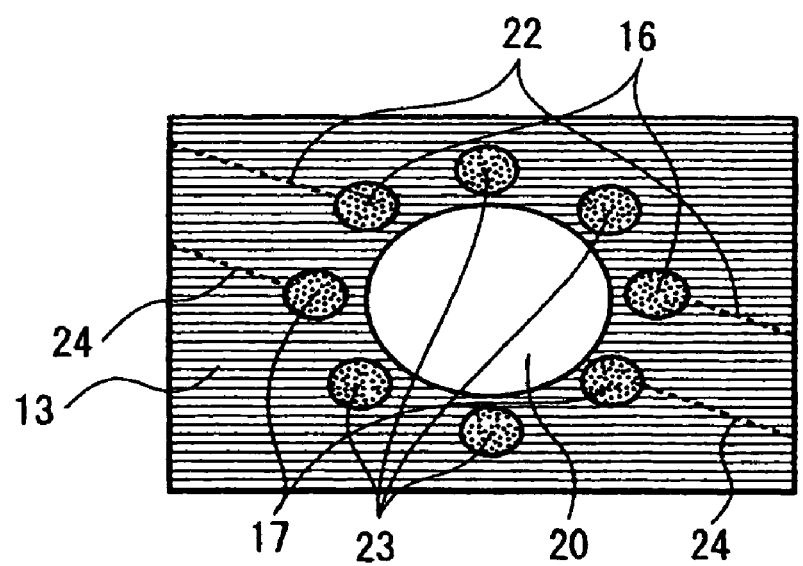

FIG. 7A is an enlarged sectional view illustrating boss portions, and FIG. 7B is a top view illustrating plural conductors formed on a wiring board 13.

In the sixth embodiment, additional conductors 23 as well as first conductive members 16 and second conductive members 17 are formed in the circumference of a gap 20. Of the plural conductors, wirings 22 and 24 are connected to the first conductive members 16 and the second conductive members 17, and electric resistance values for each connection are measured. In addition, there are provided the conductors 23 of which the electric resistance value is not measured. Only the shape and number of the conductors are different from those in the fourth embodiment and the rest configuration is the same as that in the fourth embodiment. The shape of the conductors is different from that in the first embodiment, but the same advantage is obtained.

Next, an electronic apparatus according to a seventh embodiment of the invention will be described with reference to FIGS. 8A and 8B. The same reference numerals are given the same elements as those in the first embodiment, and the detailed description is omitted.

Figure 8A:
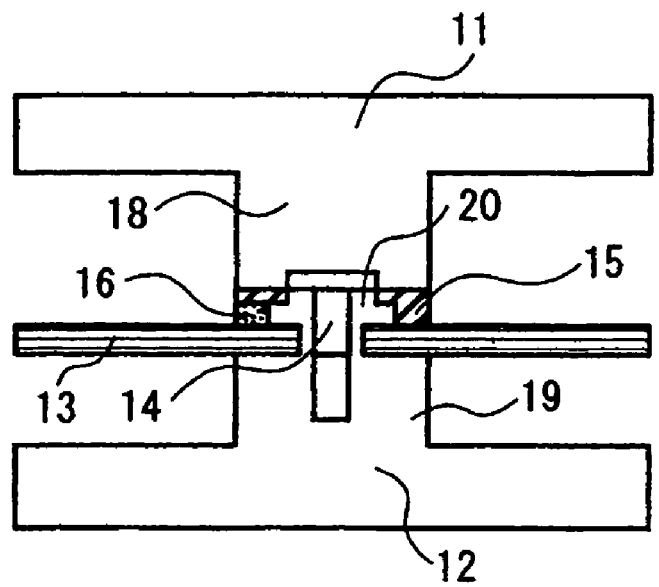

FIG. 8A is an enlarged sectional view illustrating boss portions. FIG. 8B is a perspective view illustrating a first conductive member 16 formed in a wiring board 13 and illustrating a second conductive member 17 and a third conductive member 15 monolithically formed with each other.

Figure 8B:
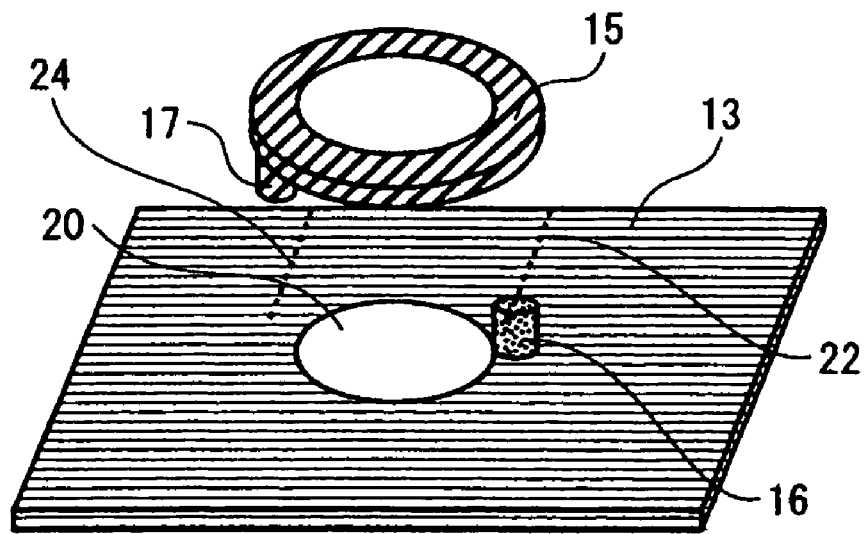

In the seventh embodiment, as shown in FIGS. 8A and 8B, the first conductive member 16 is mounted in the circumference of a gap 20 between the circuit board 13 and a first boss portion 18 by a soldering process like other elements. On the circuit board 13, a first wiring 22 electrically connected to the first conductive member 16 and a second wiring 24 electrically connected to the second conductive member 17 are formed. A method of forming the first conductive member 16, the second conductive member 17, and the third conductive member 15 is different in part from the method in the first embodiment, but the same advantage can be obtained.

It is to be understood that the present invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from all components shown in the embodiments. Further, the components in different embodiments may be used appropriately in combination.

What is claimed is:

1. An electronic apparatus comprising: a first case half that is provided with a first boss portion; a second case half that is provided with a second boss portion, the second case half being coupled with the first case half to form a single case by joining the first boss portion and the second boss portion;
 a circuit board that is disposed inside the case, the circuit board being interposed between the first boss portion and the second boss portion;
 a first conductive member and a second conductive member that are disposed on the circuit board and between the first boss portion and the circuit board, the second conductive member being disposed apart from the first conductive member;
 a third conductive member that is disposed between the first boss portion and the first conductive member and between the first boss portion and the second conductive member to electrically connect the first conductive member to the second conductive member, the third conductive member being disposed as separate from the circuit board;
 a first wiring and a second wiring that are formed on the circuit board, the first wiring and the second wiring being electrically connected respectively to the first conductive member and the second conductive member; and a measurement circuit that is electrically connected to the first wiring and the second wiring and measures an electrical characteristic value of at least one of the first conductive member and the second conductive member.

2. The apparatus according to claim 1, wherein the first conductive member and the second conductive member are formed of a solder material.

3. The apparatus according to claim 1, wherein the measurement circuit measures, as the electrical characteristic value, at least one of a resistance value, a voltage value, and a current value of at least one of the first conductive member and the second conductive member.

4. The apparatus according to claim 1, wherein the first conductive member, the second conductive member, and the third conductive member are monolithically formed.

5. The apparatus according to claim 1 further comprising a functional circuit that outputs a signal when the electrical characteristic value measured by the measurement circuit is beyond a predetermined level.

6. The apparatus according to claim 1 further comprising a functional circuit that outputs a signal when a tendency of variation in the electrical characteristic value is changed.

* * * * *